United States Patent [19]

Itabashi et al.

[11] Patent Number: 4,705,598
[45] Date of Patent: Nov. 10, 1987

[54] METHOD OF PRODUCING PHOTOSENSOR

[75] Inventors: Satoshi Itabashi, Atsugu; Soichiro Kawakami; Katsunori Terada, both of Sagamihara; Hideyuki Suzuki, Machida; Teruhiko Furushima, Hiratsuka; Masaki Fukaya, Isehara, all of Japan

[73] Assignee: Canon Kabushiki Kaisha, Tokyo, Japan

[21] Appl. No.: 5,850

[22] Filed: Jan. 21, 1987

[30] Foreign Application Priority Data

Jan. 27, 1986 [JP] Japan .................................. 61-13783

[51] Int. Cl.⁴ ...................... H01L 21/306; B44C 1/22; C23F 1/02
[52] U.S. Cl. ........................................ 156/643; 437/2; 156/646; 156/652; 156/653; 156/656; 156/657; 156/659.1; 156/662
[58] Field of Search .................. 29/572; 136/244, 258; 156/643, 646, 652, 656, 657, 659.1, 653, 662; 204/192.3, 192.32, 192.35, 192.37; 357/30, 65, 67, 71

[56] References Cited

U.S. PATENT DOCUMENTS 4,581,099 4/1986 Fukaya et al. ...................... 156/643

Primary Examiner—William A. Powell
Attorney, Agent, or Firm—Fitzpatrick, Cella, Harper & Scinto

[57] ABSTRACT

A method of producing a photosensor having a photoconductive layer and a pair of electrodes provided through an ohmic contact layer on the same surface of the photoconductive layer for applying a voltage to the photoconductive layer. The method comprises the steps of: forming an insulating layer on one surface of the photoconductive layer except at portions where the pair of electrodes is to be formed; forming a layer of an ohmic contact layer forming material on the insulating layer; forming a layer of an electrode forming material on the layer of an ohmic contact layer forming material; and removing the electrode forming material except at the portions where the pair of electrodes is to be formed, and the ohmic contact layer forming material.

3 Claims, 12 Drawing Figures

METHOD OF PRODUCING PHOTOSENSOR

BACKGROUND OF THE INVENTION

1. Field of the Invention

The present invention relates to a photosensor. A photosensor is very often used as a photoelectric conversion apparatus for processing image information, for example, in a facsimile and/or a digital copying machine.

2. Related Background Art

As an example of a photosensor, a planar type photoconductive photosensor can be taken which is fabricated by providing a pair of opposing electrodes, the spacing between which forms a photoreceptor, on a photoconductive layer of chalcogenide, CdS, CdSSe or amorphous silicone (hereinafter referred to as the a—Si). Photoconductive photosensors can easily constitute a long line sensor array and is especially recently researched and developed. Among others, a photosensor using an a—Si photoconductive layer is excellent in optical response characteristic and expected as a photosensor which will allow for high speed reading.

FIG. 1 is a plan view of one example of such a photoconductive photosensor. FIG. 2 is a cross-sectional view taken alone the line V—V of FIG. 1. In FIGS. 1 and 2, reference numerals 22, 24 and 26 denote a transparent glass substrate, an a—Si photoconductive layer and an ohmic contact layer, respectively. Reference numerals 28 and 30 denote a pair of electrodes. Like this, there is generally a layer which produces an ohmic contact between photoconductive layer 24 and electrodes 28, 30.

Conventionally, such a photosensor is formed by steps such as those shown in FIG. 3.

Namely, a—Si photoconductive layer 24 is first formed on the upper surface of glass substrate 22 by plasma CVD using as a material a silane gas such as $SiH_4$ gas. Next, an $n^+$ layer 26' is formed by plasma CVD on photoconductive layer 24 by using as a material a mixture of the silane gas and a doping gas of $PH_3$ or $AsH_3$. A conductive layer 28' of metal such as Al is deposited on $n^+$ layer 26' by vacuum evaporation or sputtering. (FIG. 3A).

Subsequently, photoconductive layer 28' is patterned by conventional wet etching to form electrodes 28, 30 (FIG. 3B). Exposed $n^+$ layer 26' portion is removed by etching with electrodes 28, 30 being used as mask to form ohmic contact layer 26 (FIG. 2). (Problems which the Invention is Intended to Solve)

In the above method of producing a conventional photosensor, removal of unnecessary $n^+$ layer 26' is performed by either wet etching or dry etching such as plasma etching.

When wet etching is used, etch pit is likely occur on the surface of photoconductive layer 24 exposed to an etching solution and the selectivity of etching is considerably large, so that an $n^-$ layer is likely to be formed on the surface of photoconductive layer 24. On the other hand, when dry etching is used, the component of the cathode material will undesiably be implanted. Each of these problems will deteriorate the photosensor characteristic. A common problem to both the etching methods is that these etching methods would roughen the surface of photoconductive layer 24 to reduce the S/N ratio.

(Means to Solve the Problems)

According to the present invention, in order to solve the above prior art problems, there is provided a method of producing a photosensor, comprising the steps of forming an insulating layer on one surface of a photoconductive layer except on portions where electrodes are to be formed, forming a layer of an ohmic contact layer forming material on the insulating layer, forming a layer of an electrode forming material on the layer of the ohmic contact layer forming material, and removing the electrode forming material except at the portions where the electrodes are to be formed, and the ohmic contact layer forming material.

DETAILED DESCRIPTION OF THE PREFERRED EMBODIMENT

An embodiment of the present invention will now be described with reference to the drawings.

FIGS. 4A-F is illustrate the process illustrating one embodiment of the inventive method.

Figure 4A:
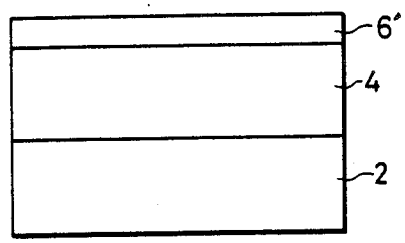
FIGS. 4A-F illustrate the steps of the inventive method.

First, an a—Si photoconductive layer 4 is deposited and formed on a glass substrate 2 by plasma CVD using silane gas such as $SiH_4$ as a material. A $SiO_2$ layer 6' of an insulating layer forming material is formed on the photoconductive layer by vacuum evaporation or sputtering (FIG. 4A).

Figure 4B:
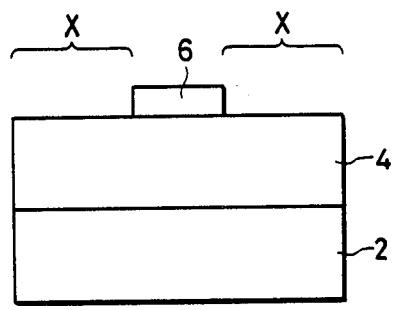

Subsequently, photoresist is coated on $SiO_2$ layer 6', patterning is performed on the photoresist layer to eliminate portions X where electrodes are to be formed, a reactive ion etching is performed using the patterned photoresist layer as a mask to eliminate the $SiO_2$ layer 6' at the electrode forming portions, thereby forming insulating layer 6 (FIG. 4B).

Figure 4C:
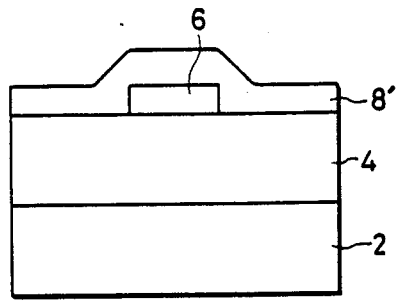

Then, an $n^+$ layer 8' is deposited and formed by plasma CVD on the overall exposed photoconductive layer portions 4 and insulating layer 6 using a mixture of silane gas and a doping gas such as $PH_3$ or $AsH_3$ as a material (FIG. 4C).

Figure 4D:
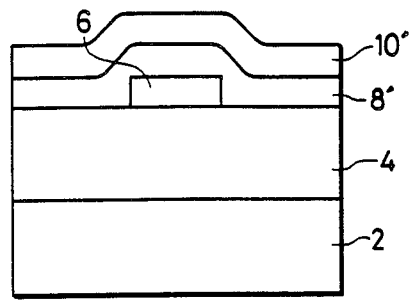

Conductive layer 10' of metal such as Al is then deposited and formed by vacuum evaporation on the overall surface of $n^+$ layer 8' (FIG. 4D).

Figure 4E:
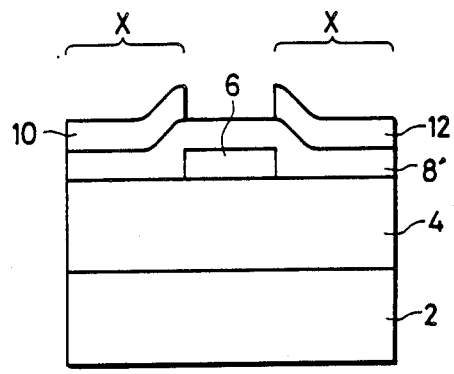

Photoresist if then coated on photoconductive layer 10', patterning is performed on this layer so as to leave only electrode forming portions X, and etching is performed using the patterned photoresist layer as a mask to form electrodes 10, 12 (FIG. 4E).

Figure 4F:
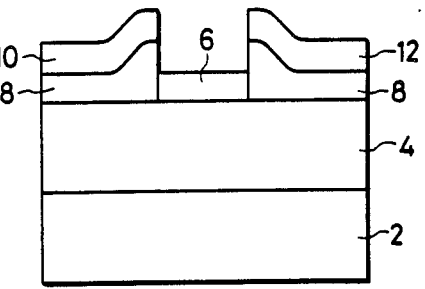

Subsequently, exposed $n^+$ layer 8' is removed by plasma etching using $CF_4$ gas with electrodes 10, 12 being used as a mask in order to form ohmic contact layers 8 (FIG. 4F).

Figure 1:
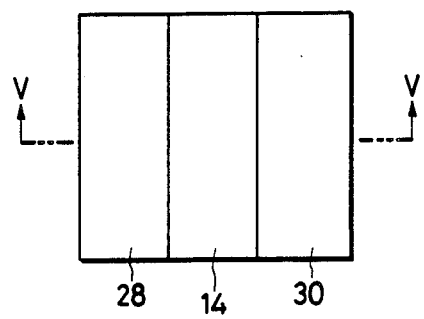
FIG. 1 is a plan view of a prior art photosensor.
Figure 2:
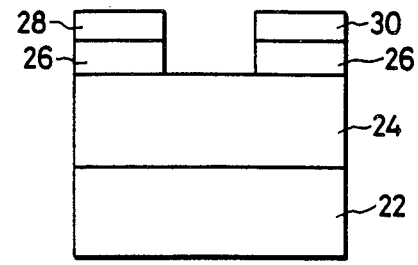
FIG. 2 is a cross-sectional view of taken along the line V—V of FIG. 1.
Figure 5:
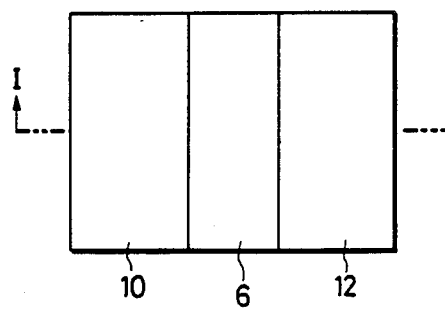
FIG. 5 is a plan view of a photosensor produced by the inventive method.

Thus, a photosensor is produced. FIG. 2 is a plan view of this photosensor. In this connection, FIG. 4 is a cross-sectional view taken along the line I—I of FIG. 5.

While $SiO_2$ is used as an insulating layer forming material in the above example, an inorganic material such as SiN or SiC may be used as an insulating layer forming material in this invention.

The patterning means to form insulating layer 6, ohmic contact layers 8 and electrodes 10, 12 may be selected properly depending on the kinds of these materials and other requirements.

Figure 3A:
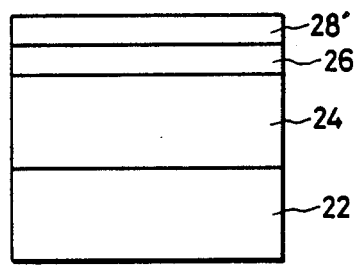
FIGS. 3A-B illustrate the steps of producing a prior art photosensor.
Figure 3B:
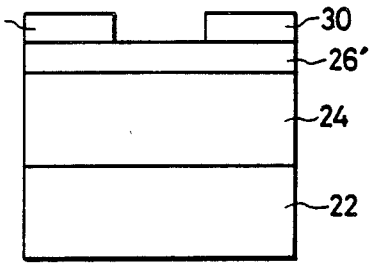
Figure 6:
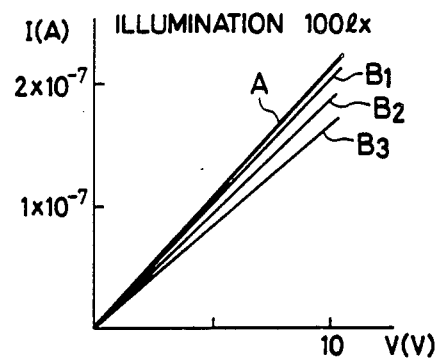
FIG. 6 is a graph of the V-I characteristic of a photosensor.

FIG. 3 is a graph showing the photoelectric current (V-I) characteristics of the photosensors produced by the above example and the prior art method. In FIG. 6, reference character A denotes the characteristic of the photosensor produced by the example of the present invention and reference characters $B_1$, $B_2$ and $B_3$ denote the characteristics of the photosensors produced by the prior art method.

The characteristic of the photosensor according to the present invention still remains unchanged even after an elapse of several hundreds of hours while the photosensors according to the prior art method initially exhibited the characteristic $B_1$, the characteristic $B_2$ after an elapse of several hours, and the characteristic $B_3$ after an elapse of several tens of hours. It will be understood that the characteristic of the prior art photosensor will deteriorate with time.

While a—Si was used as photocondcutive layer 4 in the above example, the present invention is also applicable when other materials are used as photoconductive layers.

According to the above example, no damage is done by etching to the photoconductive layer of a photoreceptor between a pair of electrodes, so that a photosensor having a very excellent and stable characteristic is obtained.

We claim:

1. A method of producing a photosensor having a photoconductive layer and a pair of electrodes provided through an ohmic contact layer on the same surface of said photoconductive layer for applying a voltage to said photoconductive layer, comprising the steps of:
    forming an insulating layer on one surface of said photoconductive layer except at portions where said pair of electrodes is to be formed;
    forming a layer of an ohmic contact layer forming material on said insulating layer;
    forming a layer of an electrode forming material on said layer of an ohmic contact layer forming material; and
    removing said electrode forming material except at the portions where said pair of electrodes is to be formed, and said ohmic contact layer forming material.

2. A method of claim 1, wherein said forming of said insulating layer except at the portion where said pair of electrodes is to be formed is performed by removing the insulating layer forming material at the portions where said pair of electrodes is to be formed after said insulating layer forming material is applied to the overall surface of said photoconductive layer.

3. A method of claim 1, wherein both said photoconductive layer and said ohmic contact layer are made of an amorphous silicon-based material.

* * * * *